United States Patent [19]
Foote et al.

[11] Patent Number: 6,114,235
[45] Date of Patent: Sep. 5, 2000

[54] MULTIPURPOSE CAP LAYER DIELECTRIC

[75] Inventors: David K. Foote, San Jose; Minh Van Ngo, Union City; Christopher F. Lyons, Fremont; Fei Wang, San Jose; Raymond T. Lee, Sunnyvale; William G. En, Sunnyvale; Susan H. Chen, Sunnyvale; Darin A. Chan, Campbell, all of Calif.

[73] Assignee: Advanced Micro Devices, Inc., Sunnyvale, Calif.

[21] Appl. No.: 08/924,571

[22] Filed: Sep. 5, 1997

[51] Int. Cl.⁷ ..................................... H01L 21/44
[52] U.S. Cl. .................. 438/636; 438/637; 438/633; 438/945
[58] Field of Search ...................... 438/618, 636, 438/624, 637, 669, 671, 633, 945

[56] References Cited

U.S. PATENT DOCUMENTS

| | | |
|---|---|---|
| 5,387,535 | 2/1995 | Wilmsmeyer . |
| 5,391,520 | 2/1995 | Chen et al. . |
| 5,453,400 | 9/1995 | Abernathey et al. . |
| 5,468,342 | 11/1995 | Nulty et al. ............................. 438/714 |
| 5,489,797 | 2/1996 | Chan et al. . |
| 5,516,726 | 5/1996 | Kim et al. . |
| 5,521,106 | 5/1996 | Okabe . |
| 5,563,096 | 10/1996 | Nasr . |
| 5,589,415 | 12/1996 | Blanchard . |
| 5,621,232 | 4/1997 | Ohno . |
| 5,621,235 | 4/1997 | Jeng . |
| 5,710,067 | 1/1998 | Foote et al. . |
| 5,886,410 | 3/1999 | Chiang et al. .......................... 257/759 |

*Primary Examiner*—Caridad Everhart

[57] ABSTRACT

A multipurpose cap layer serves as a bottom anti-reflective coating (BARC) during the formation of a resist mask, a hardmask during subsequent etching processes, a hardened surface during subsequent deposition and planarization processes, and optionally as a diffusion barrier to mobile ions from subsequently deposited materials.

6 Claims, 3 Drawing Sheets

MULTIPURPOSE CAP LAYER DIELECTRIC

TECHNICAL FIELD

The present invention relates to semiconductor devices and manufacturing processes, and more particularly to methods and arrangements for forming local interconnects within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as via or trench that connects the selected regions together. The use of lower-level local interconnects reduces the coupling burden on the subsequently formed higher layers to provide such connectivity, which reduces the overall circuit size and as such tends to increase the circuit's performance. Accordingly, there is a continuing need for more efficient and effective processes for forming local interconnects.

SUMMARY OF THE INVENTION

The present invention addresses this, and other needs, by providing methods and arrangements that form interconnects within an integrated circuit by taking advantage of a novel, multipurpose, cap layer. The multipurpose cap layer, in certain embodiments, advantageously serves as a bottom anti-reflective coating (BARC) during the formation of a resist mask, a hardmask during subsequent etching processes, a hardened surface during subsequent deposition and planarization processes, and as a diffusion barrier to mobile ions from subsequently deposited materials. As such, the methods and arrangements of the present invention provide increased precision in, and better process control over, the interconnect formation process, and in particular damascene techniques that include the resist patterning, etching, deposition, and planarization/polishing processes.

In accordance with certain embodiments of the present invention, there is provided a method for forming a local interconnect to a contact surface that is located below a dielectric layer within a semiconductor wafer stack. This method includes depositing a cap layer on top of the dielectric layer and covering at least a portion of the cap layer with a resist layer. The cap layer is then used as a bottom anti-reflective coating while patterning the resist layer into a resist mask. The resist mask includes at least one etch window that exposes a selected portion of the cap layer. The method further includes etching through the selected portion of the cap layer to expose corresponding portions of the dielectric layer. The cap layer is then used as a hardmask while etching through the corresponding portions of the dielectric layer. This etching creates an opening that exposes the contact surface. Having etched an opening, the method further includes depositing a conductive material in the opening and on portions of the cap layer, and then removing the excess conductive material located outside of the etched opening to form a local interconnect within the opening. Thus, the local interconnect has an exposed surface that has been planarized and/or polished to be substantially level with the cap layer. In certain embodiments, the cap layer is made of either $Si_{(1-x+y+z)}N_xO_y{:}H_z$, $SiO_xN_y$, or $Si_3N_4$.

The above need and others are also met by another embodiment of the present invention that provides a method for forming a local interconnect. This method includes providing a wafer stack that has a plurality of layers and at least one contact surface, and depositing a dielectric material in the form of a cap layer on top of the wafer stack. The method then includes using the cap layer as a bottom anti-reflective coating while forming a resist mask above the cap layer, using the cap layer as a hardmask while etching one or more of the plurality of layers, and using the cap layer to protect at least one of the layers within the wafer stack while performing a chemical-mechanical polish of the wafer stack. In another embodiment, the method also includes using the cap layer as a diffusion barrier between the wafer stack and a third material deposited on at least a portion of the cap layer.

In yet another embodiment of the present invention there is provided an arrangement having a local interconnect. The arrangement includes a substrate having a contact surface, a dielectric layer covering at least a portion of the contact surface, a cap layer on at least a portion of the dielectric layer, and a conductive material electrically coupled to the contact surface. In this arrangement, the conductive material extends through both the cap and dielectric layers and is substantially level with the top surface of the cap layer. In this embodiment and others, the cap layer is essentially a multipurpose cap layer that is made of $Si_{(1-x+y+z)}N_xO_y{:}H_z$ and used as a bottom anti-reflective coating, a hardmask, a hardened protective coating, and in certain embodiments as a diffusion barrier during subsequent fabrication processes.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the important features of the present invention.

Figure 1A:
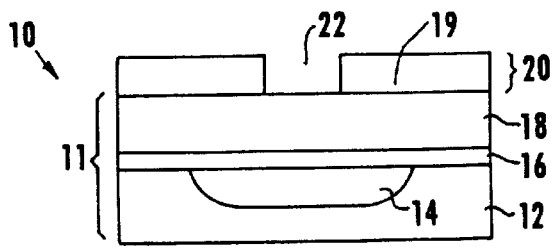
FIG. 1a depicts a cross-section of a portion of a typical semiconductor wafer that has been prepared for a conventional local interconnect formation process.

With this in mind, the limitations of the prior art methods and arrangements will first be described as depicted in FIGS. 1a through 1g. FIG. 1a depicts a cross-section of a portion 10 of a typical semiconductor wafer that has been prepared for a conventional local interconnect formation process. Portion 10 includes a wafer stack 11 having a substrate 12, a stop layer 16 and a dielectric layer 18. As depicted, there is also a resist mask 20 that has been patterned on a top surface 19 of dielectric layer 18. Resist mask 20 includes at least one etch window 22 that leaves selected portions of top surface 19 exposed. Substrate 12, as depicted, includes at least one active region 14, that represents an area within a semiconductor device, for example, a contact, gate, line, drain/source, and/or the like, that is to be electrically connected to other areas through a local interconnect. As depicted, etch window 22 is positioned substantially above active region 14.

Figure 1E:
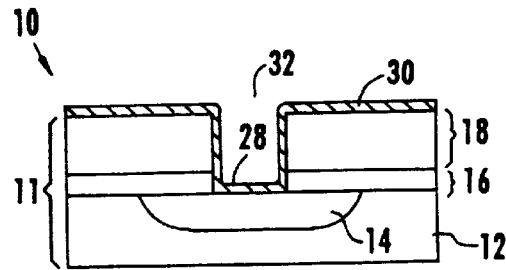
FIGS. 1e through 1g depict, sequentially, the cross-section of the portion in FIG. 1d at various stages in a conventional local interconnect deposition and planarization process.
Figure 1B:
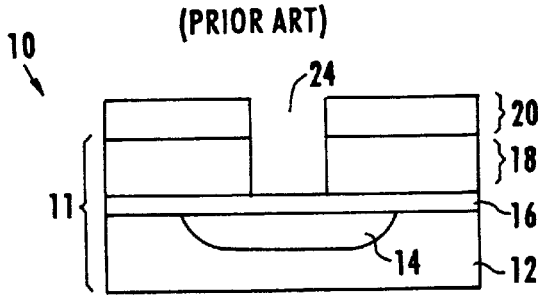
FIGS. 1b through 1d depict, sequentially, the cross-section of the portion in FIG. 1a at various stages in a conventional local interconnect etch process.
Figure 1F:
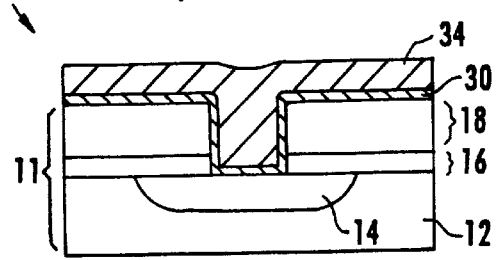
Figure 1C:
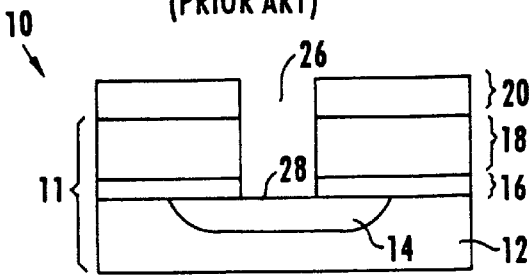
Figure 1G:
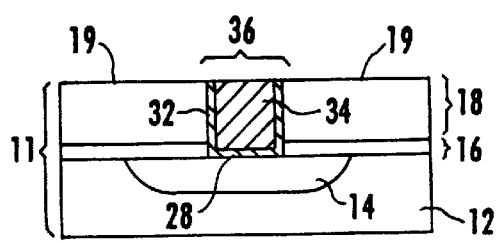
Figure 1D:
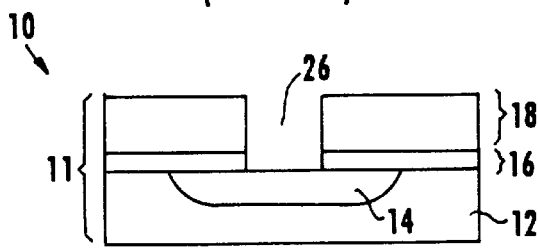

FIGS. 1b through 1d depict, sequentially, the cross-section of the portion in FIG. 1a at various stages in a conventional local interconnect etch process. In FIG. 1b, dielectric layer 18 has been anisotropically etched to create an initial etched opening 24 that extends through dielectric layer 18 to reveal a portion of stop layer 16. Next, as shown in FIG. 1c, the revealed portions of stop layer 16 are etched to create etched opening 26 that exposes a contact surface 28 of active region 14. Having completed the local interconnect etching process, as shown in FIG. 1d, resist mask 20 is removed using a conventional resist stripping technique.

FIGS. 1e through 1g depict, sequentially, the cross-section of the portion in FIG. 1d at various stages in a conventional local interconnect deposition and planarization process. An optional adhesion layer 30 is applied to the exposed surfaces of portion 10, as shown in FIG. 1e. Adhesion layer 30 is typically a thin layer of titanium nitride (TiN) or like material that helps to secure a subsequent conductive layer 34, such as, for example, tungsten (W), to various surfaces of portion 10, and/or increase conductivity of the local interconnect formed from conductive layer 34 and adhesion layer 30. Adhesion layers are known in the art and in certain embodiments further provide a barrier layer between the conductive material and the underlying layers.

FIG. 1f depicts portion 10 with a conformal deposited layer of conductive material 34. As shown in FIG. 1f, conductive layer 34 fills in a prepared opening 32 (FIG. 1e) as created by adhesion layer 30 in etched opening 26. FIG. 1g depicts portion 10, of FIG. 1f, following a typical chemical-mechanical polish (CMP) process that removes those portions of conductive layer 34 and adhesion layer 30 that are above top surface 19. The resultant structure is a local interconnect 36 that is electrically coupled to contact surface 28.

The methods and resulting arrangements as described above and depicted in FIGS. 1a through 1g have several distinct disadvantages when compared to the methods and arrangements of the present invention. By way of example, one disadvantage is that resist mask 20 is typically susceptible to standing waves and other reflective interference waves during formation, which often limits the critical dimension (CD) in subsequent etching processes. Another disadvantage is that dielectric layer 18, which is usually an oxide, is susceptible to damage (e.g., scratching) caused during the CMP process as a result of its softness when compared to conductive layer 34, which is typically a metal such as tungsten (W). A further disadvantage is that dielectric layer 18, in certain embodiments, is susceptible to diffusion by mobile ions from a subsequently formed layer, such as, for example, a layer of metal. This diffusion, which in certain instances degrades the semiconductor device by introducing excessive leakage or shorts, often requires that an additional barrier layer be added to wafer stack 11 following local interconnect formation.

These disadvantages are addressed by the present invention in which, in accordance with certain embodiments, there are provided methods and arrangements for forming at least one local interconnect within an integrated circuit using a multipurpose cap layer. The multipurpose cap layer, in certain embodiments, advantageously serves as a bottom anti-reflective coating (BARC) during the formation of a resist mask, a hardmask during subsequent etching processes, a hardened surface during subsequent deposition and planarization processes, and as a diffusion barrier to mobile ions from subsequently deposited materials. Thus the methods and arrangements, according to the present invention allow for greater precision in, and better process control over, the local interconnect formation process, including the resist patterning, etching, deposition, and planarization/polishing processes. Moreover, the multipurpose cap layer in certain embodiments also prohibits unwanted ion diffusion from higher layered materials in subsequent fabrication processes.

Figure 2A:
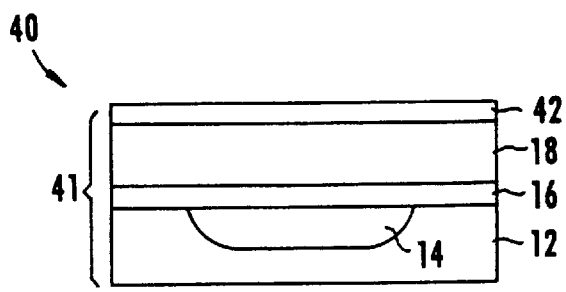
FIG. 2a depicts a cross-section of a portion of a semiconductor wafer, including a multipurpose cap layer, that is being prepared for a local interconnect formation process, in accordance with embodiments of the present invention.

With this in mind, FIG. 2a depicts a cross-section of a portion 40 of a semiconductor wafer, having a wafer stack 41, that is similar in many respects to wafer stack 11 in FIG. 1a (and with which common reference numbers remain consistent), with the exception that wafer stack 41 further includes a cap layer 42 which is deposited on dielectric layer 18. Cap layer 42 is preferably a film of silicon oxime (e.g., $Si_{(1-x+y+z)}N_xO_y:H_z$), highly silicon-rich silicone oxynitride (e.g., $SiO_xN_y$), or silicon nitride (e.g., $Si_3N_4$).

Silicon oxime, which is described in more detail in co-pending U.S. patent application Ser. No. 08/479,718, filed Jun. 7, 1995, now U.S. Pat. No. 5,710,067, differs structurally from conventional silicon oxynitride material in that the silicon atoms are bonded directly to the nitrogen atoms, while the oxygen atoms are bonded to the nitrogen atoms. Thus, in silicon oxime, there is essentially no bonding between silicon and oxygen atoms as characterized by the formula $Si_{(1-x+y+z)}N_xO_y:H_z$. By way of example, silicon oxime can be produced by reacting source gases for the components (i.e., silicon, nitrogen, oxygen, and hydrogen), under dynamic (e.g., non-equilibrium) conditions employing a stoichiometric excess amount of nitrogen, sufficient to substantially prevent oxygen atoms from reacting with silicon atoms. For example, in one embodiment, the concentration of nitrogen is at least ten times greater than the concentration of oxygen during the reaction within a conventional PECVD reactor, such as that typically used to deposit silicon oxynitride.

Cap layer 42 is provided at this stage of the local interconnect formation process as a bottom anti-reflective coating (BARC) for use in forming a more precisely controlled resist mask. The benefits of using a BARC are known in the art. For example, cap layer 42 can be formed to suppress particular wavelengths associated with interference waves and/or standing waves that would otherwise be produced by one or more underlying layers in wafer stack 41 during subsequent resist patterning process steps. Thus, as discussed in greater detail below, when combined with the proper lithographic techniques, cap layer 42 allows higher density layouts to be fabricated by providing better patterning processes. Furthermore, cap layer 42 provides a barrier layer between dielectric layer 18 and the resist mask 46 (see FIG. 2c).

Resist mask 46, in accordance with an embodiment of the present invention, is formed by depositing a resist layer 44, as in FIG. 2b, over cap layer 42, and subsequently patterning resist layer 44. By way of example, resist layer 44 in certain embodiments is a deep-UV resist sensitive material that is processed using associated lithography techniques. Thus, for example, in such an embodiment cap layer 42 is tuned to absorb deep-UV wavelengths (e.g., 248 nm) during the patterning of resist layer 44 so as to reduce the potential of reflective waves. As depicted in FIG. 2c, resist mask 46 includes at least one etch window 48 that exposes selected portions of a top surface 47 of cap layer 42.

Figure 2E:
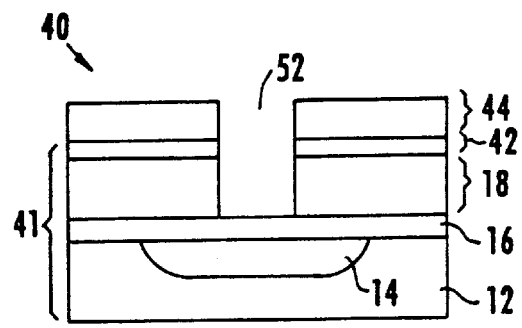
FIGS. 2d through 2f depict, sequentially, the cross-section of the portion in FIG. 2c at various stages in a local interconnect etching process that uses the multipurpose cap layer as a hardmask, in accordance with embodiments of the present invention.
Figure 2B:
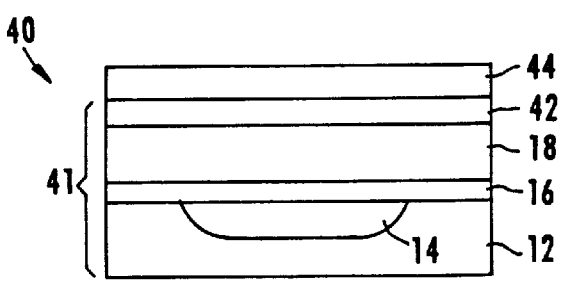
FIGS. 2b and 2c depict, sequentially, the cross-section of the portion in FIG. 2a at various stages in a resist mask formation process that uses the multipurpose cap layer as a bottom anti-reflective coating, in accordance with embodiments of the present invention.
Figure 2F:
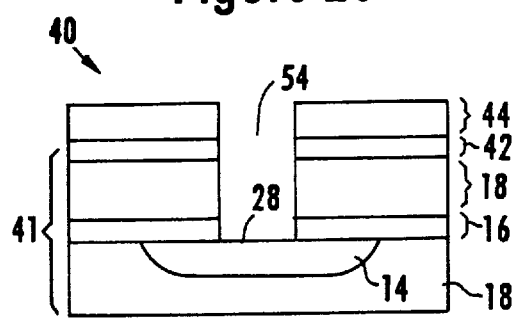
Figure 2C:
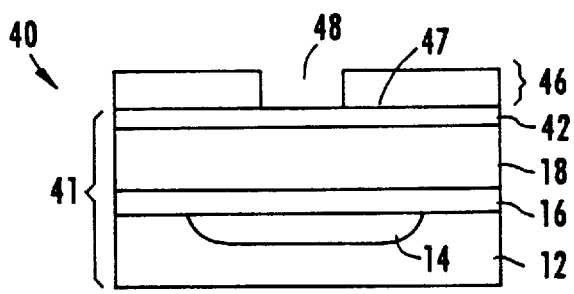
Figure 2G:
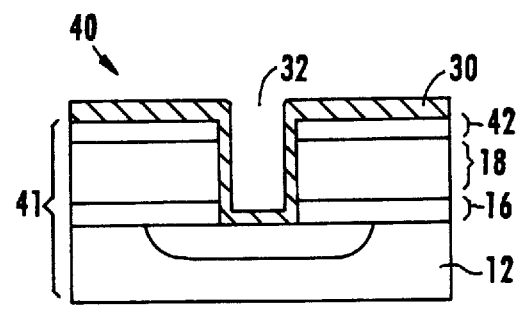
FIGS. 2g through 2i depict, sequentially, the cross-section of the portion in FIG. 2f at various stages in a local interconnect deposition and planarization process that uses the multipurpose cap layer to protect the underlying layers during planarization and final shaping of the local interconnect, in accordance with embodiments of the present invention.
Figure 2D:
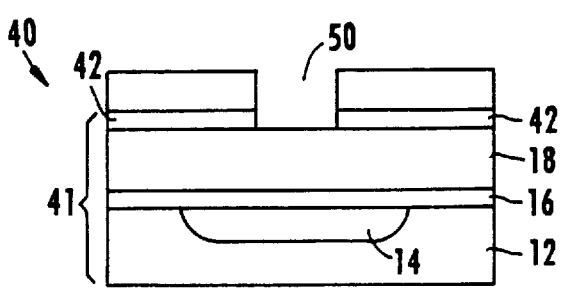

FIGS. 2d through 2f depict, sequentially, cross-sections of the portion in FIG. 2c at various stages in a conventional local interconnect etch process. As depicted in FIG. 2d the exposed/selected portion of cap layer 42 has been anisotropically etched to create an extended etch window 50 that extends through cap layer 42 to further reveal a portion of dielectric layer 18. At this stage in the local interconnect formation process, cap layer 42 has been patterned and formed to function as a hardmask during subsequent etching processes.

Thus, by using cap layer 42 as a hardmask (with or without resist mask 46), as shown in FIG. 2e, the revealed portions of dielectric layer 18 have been anisotropically etched to create an initial etched opening 52 that extends through dielectric layer 18 to reveal a portion of stop layer 16. Next, as shown in FIG. 2f, the revealed portion of stop layer 16 is anisotropically etched to create an etched opening 54 that exposes contact surface 28 of active region 14.

Having completed the local interconnect etching process, in accordance with one embodiment of the present invention (as shown, for example in FIG. 2g), resist mask 46 is then removed used a conventional resist stripping technique. Alternatively, resist mask 46 can be removed prior to etching either layer 18 or 16, and/or in-situ when etching either layer 18 or 16.

Figure 2H:
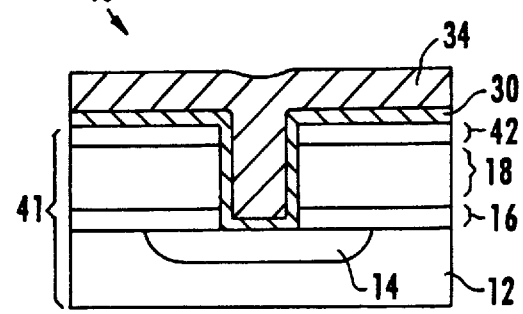
Figure 2I:
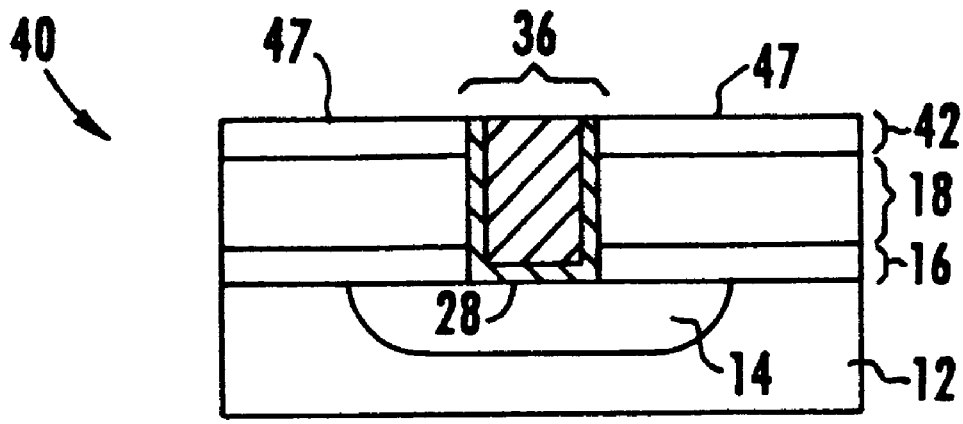

FIGS. 2g through 2i depict, sequentially, the cross-section of the portion in FIG. 2f at various stages in a local interconnect deposition and planarization process, in accordance with an embodiment of the present invention. In FIG. 2g, an adhesion layer 30 is applied to the exposed surfaces of portion 40 following a resist stripping process. Adhesion layer 30 is preferably a thin layer of titanium nitride (TiN). Next, as shown in FIG. 2h, a conductive material 34, preferably tungsten is deposited over portion 40. As shown in FIG. 2h, conductive layer 34 fills in a prepared opening 32 (FIG. 2g) as created by adhesion layer 30 in etched opening 54.

FIG. 2i depicts portion 40, of FIG. 2h, following a CMP process that removes those portions of conductive layer 34 and adhesion layer 30 that are above top surface 47 of cap layer 42. Thus, at this stage in the local interconnect formation process cap layer 42 serves as a protective surface that is significantly harder than the oxide preferably used in dielectric layer 18. For example, silicon oxime is significantly harder than a tetraethylorthosilicate (TEOS) oxide and as such is much less likely to be damaged in the CMP process. The result is a local interconnect 36 that is electrically coupled to contact surface 28.

Figure 3:
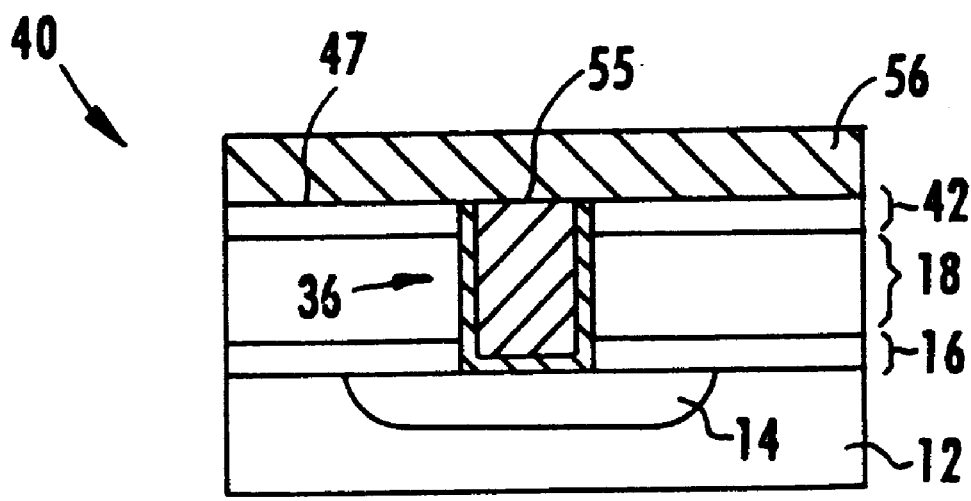
FIG. 3 depicts the cross-section of the portion in FIG. 2i in a subsequent deposition process that adds a conductive layer to the portion and the multipurpose cap layer acts as a diffusion barrier layer between the conductive layer and the other layers of the wafer.

FIG. 3 depicts portion 40, of FIG. 2i, that has been further processed such that a metal layer 56 has been deposited over cap layer 42 and local interconnect 36. As shown, metal layer 56, which can be any conductive material, is in electrical contact with an exposed surface 55 of local interconnect 36. As such, in this exemplary embodiment, cap layer 42 provides a diffusion barrier to mobile ions in metal layer 56.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a local interconnect to a contact surface located below a dielectric layer within a semiconductor wafer stack, the method comprising:

depositing a cap layer on at least a portion of the dielectric layer, wherein the cap layer has an exposed top surface;

covering at least a portion of the top surface of the cap layer with a resist layer;

using the cap layer as a bottom anti-reflective coating and patterning the resist layer to form a resist mask that includes at least one etch window that exposes a selected portion of the top surface of the cap layer;

etching through the selected portion of the top surface of the cap layer to expose a selected portion of the dielectric layer;

using the cap layer as a hardmask and etching through the selected portion of the dielectric layer to create an opening that exposes at least a portion of the contact surface;

depositing a conductive material on at least a portion of the top surface, wherein the conductive layer substantially fills the opening; and removing the conductive material located outside of the opening to form a local interconnect within the opening, wherein the local interconnect has an exposed surface that is substantially level with the top surface of the cap layer, wherein the method further comprises removing the resist mask before using the cap layer as a hardmask;

wherein the cap layer comprises $Si_{(1-x+y+z)}N_xO_y{:}H_z$ or $SiO_xN_y$.

2. The method as recited in claim 1, wherein the resist mask is etched away during the etching through of selected portions of the dielectric layer.

3. The method as recited in claim 1, wherein the cap layer is configured to attenuate interference waves produced in forming the resist mask.

4. The method as recited in claim 3 wherein the resist mask is formed using deep-UV wave forms and the cap layer attenuates interference waves having an approximate wavelength of 248 nm.

5. A method for forming a local interconnect, the method comprising:

providing a wafer stack that includes a plurality of layers and at least one contact surface within one of the plurality of layers;

depositing a dielectric material in the form of a cap layer on top of the wafer stack such that the contact surface is separated from the cap layer by one or more of the plurality of layers in the wafer stack;

using the cap layer as a bottom anti-reflective coating while forming a resist mask above the cap layer;

using the cap layer as a hardmask and etching one or more of the plurality of layers; and using the cap layer to protect the plurality of layers and performing a chemical-mechanical polish of the wafer stack, wherein the method further comprises removing the resist mask before using the cap layer as a hardmask;

wherein the cap layer comprises $Si_{(1-x+y+z)}N_xO_y{:}H_z$, or $SiO_xN_y$.

6. The method as recited in claim 5, further comprising using the cap layer as a diffusion barrier between the wafer stack and a third material deposited on at least a portion of the cap layer.

* * * * *